United States Patent
Oshita

(10) Patent No.: US 9,722,548 B2
(45) Date of Patent: Aug. 1, 2017

(54) AMPLIFICATION CIRCUIT

(71) Applicant: Murata Manufacturing Co., Ltd., Nagaokakyo-shi, Kyoto-fu (JP)

(72) Inventor: Teruaki Oshita, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/192,073

(22) Filed: Jun. 24, 2016

(65) Prior Publication Data
US 2017/0026010 A1    Jan. 26, 2017

(30) Foreign Application Priority Data

Jul. 2, 2015  (JP) .................................. 2015-133914
Apr. 11, 2016  (JP) .................................. 2016-079139

(51) Int. Cl.
| H03G 5/16 | (2006.01) |
| H03F 1/56 | (2006.01) |
| H03F 3/195 | (2006.01) |
| H03F 3/72 | (2006.01) |

(52) U.S. Cl.
CPC .............. *H03F 1/565* (2013.01); *H03F 1/56* (2013.01); *H03F 3/195* (2013.01); *H03F 3/72* (2013.01); *H03F 2200/111* (2013.01); *H03F 2200/222* (2013.01); *H03F 2200/294* (2013.01); *H03F 2203/7209* (2013.01);
(Continued)

(58) Field of Classification Search
CPC .................................. H03G 5/16; H03G 9/00
USPC ......................................... 330/133, 51, 302
See application file for complete search history.

(56) References Cited

U.S. PATENT DOCUMENTS

| 7,498,878 B2 * | 3/2009 | Lim ...................... H03F 1/0288 330/124 R |
| 2006/0261911 A1 * | 11/2006 | Fukuda ................ H04B 1/0458 333/32 |
| 2009/0253373 A1 | 10/2009 | Gorbachov |

(Continued)

FOREIGN PATENT DOCUMENTS

| JP | 2006-33076 A | 2/2006 |
| JP | 2014-27501 A | 2/2014 |

(Continued)

OTHER PUBLICATIONS

Official Communication issued in corresponding Korean Patent Application No. 10-2016-0065457, mailed on Dec. 22, 2016.

*Primary Examiner* — Henry Choe
(74) *Attorney, Agent, or Firm* — Keating & Bennett, LLP

(57) ABSTRACT

An amplification circuit includes a first switching circuit that includes input terminals and first and second output terminals and that puts the second output terminal into an open state with respect to the input terminals while selectively putting the first output terminal into a state of being connected to any of the input terminals or selectively puts the second output terminal into a state of being connected to any of input terminals while putting the first output terminal into a state of being open with respect to the input terminals, a matching network that is connected to the first output terminal, an amplifier that is connected to an output side of the matching network, a second switching circuit that is connected to an output side of the amplifier, and a bypass path that electrically connects the second output terminal and an output terminal of the second switching circuit.

20 Claims, 9 Drawing Sheets

(52) U.S. Cl.
CPC ........ *H03F 2203/7233* (2013.01); *H03F 2203/7236* (2013.01); *H03F 2203/7239* (2013.01)

(56) References Cited

U.S. PATENT DOCUMENTS

2013/0043946 A1   2/2013   Hadjichristos et al.
2014/0167878 A1   6/2014   Lee

FOREIGN PATENT DOCUMENTS

| KR | 10-2010-0042590 A | 4/2010 |
| KR | 10-2013-0016597 A | 2/2013 |
| KR | 10-2014-0049602 A | 4/2014 |

\* cited by examiner

AMPLIFICATION CIRCUIT

CROSS REFERENCE TO RELATED APPLICATIONS

This application claims the benefit of priority to Japanese Patent Application 2016-079139 filed Apr. 11, 2016 and Japanese Patent Application 2015-133914 filed Jul. 2, 2015. The entire contents of each application are hereby incorporated by reference.

BACKGROUND OF THE INVENTION

1. Field of the Invention

The present invention relates to an amplification circuit and in particular relates to an amplification circuit that selectively inputs an input signal to an amplifier and selectively bypasses an amplifier.

2. Description of the Related Art

There are amplification circuits, which are for an input signal received from an antenna or the like, in which processing is performed to cause an input signal to be input to and amplified by a low-noise amplifier in the case in which the input signal is a low-power signal and to cause the input signal to bypass the low-noise amplifier in the case in which the input signal is a high-power signal.

To date, a variety of amplification circuits equipped with a bypass circuit have been proposed that selectively perform low-noise amplification and bypassing in this manner (see, for example, Japanese Unexamined Patent Application Publication No. 2014-27501).

Japanese Unexamined Patent Application Publication No. 2014-27501 discloses a variable gain amplification circuit that includes a low-noise amplifier (hereafter, "amplifier") that is connected between an input matching network and an output matching network and a bypass circuit that is connected in parallel with the amplifier in order achieve input/output impedance matching regardless of the gain control state while maintaining low-noise amplification performance. In this variable gain amplification circuit, the output matching network matches the impedance on the output side of the amplifier when a high gain mode is selected and a matching correction circuit is connected in parallel with the output matching network and matches the impedance on the output side of the bypass circuit when a low gain mode is selected.

The variable gain amplification circuit of Japanese Unexamined Patent Application Publication No. 2014-27501 is also able to cause an input signal to be input to and amplified by the amplifier when the input signal is a low-power signal and to cause the input signal to bypass the amplifier when the input signal is a high-power signal.

However, there is a problem with the variable gain amplification circuit of Japanese Unexamined Patent Application Publication No. 2014-27501 in that the input signal is affected by the frequency characteristics of the input matching network when bypassing is performed and therefore the pass band characteristics have a high frequency dependence when input signals over a wide frequency band (that is, input signals of a plurality of frequency bands) are handled. That is, although the input matching network is provided in order to match the impedance on the input side of the variable gain amplification circuit, the input signal is input to the bypass circuit without being input to the amplifier after passing through the input matching network when bypassing is performed. Therefore, for an input signal of a frequency that is outside the pass band of the input matching network, pass loss occurs at that frequency when bypassing is performed. As a result, the pass loss that occurs differs depending on the frequency of the input signal and makes it difficult to use the circuit as a reception circuit that handles input signals of a plurality of frequency bands.

Furthermore, in the variable gain amplification circuit of Japanese Unexamined Patent Application Publication No. 2014-27501, when bypassing is performed, although the amplifier is turned off, the bypass circuit and the input terminal of the amplifier are connected in parallel with each other and therefore the input signal is also affected by frequency characteristics due to the input impedance of the amplifier. Therefore, there is also a problem in that the difference in pass loss increases depending on the frequency of the input signal.

Here, changing the input matching network in order to improve the frequency dependence of the bandpass characteristics when bypassing is performed may also be considered (for example, changing the input matching network itself, changing the number of elements making up the input circuit, changing the elements themselves, changing the constant values of the elements and so forth). However, if such a change was made, the input matching network would no longer be the optimal matching network for the amplifier. Consequently, the characteristics when an input signal is amplified by the amplifier (frequency dependence of bandpass characteristics) would no longer be secured.

SUMMARY OF THE INVENTION

Accordingly, preferred embodiments of the present invention provide an amplification circuit including a bypass path in which a frequency dependence at a time of bypassing is significantly reduced or prevented compared with the related art.

An amplification circuit according to a preferred embodiment of the present invention includes a first switching circuit that includes one or more input terminals, a first output terminal and a second output terminal, and that puts the second output terminal into an open state of being open with respect to each of the one or more input terminals while selectively putting the first output terminal into a connected state of being connected to any one of the one or more input terminals or selectively puts the second output terminal into a connected state of being connected to any one of the one or more input terminals while putting the first output terminal into an open state of being open with respect to each of the one or more input terminals; a matching network that is connected to the first output terminal; an amplifier that is connected to an output side of the matching network; a second switching circuit that is connected to an output side of the amplifier and enters a non-conductive state when the first switching circuit puts the first output terminal into the open state and selectively puts the second output terminal into the connected state of being connected to any one of the one or more input terminals; and a bypass path that electrically connects the second output terminal and an output terminal of the second switching circuit.

With this configuration, a signal input to the first switching circuit is output via the second output terminal and the bypass path, which are isolated from the matching network, when bypassing is performed (when the first output terminal is put into the open state and the second output terminal is selectively connected to any one of the one or more input terminals in the first switching circuit). In other words, when bypassing is performed, the input signal does not pass through the matching network, which is connected to the input side of the amplifier, and therefore the effect of the frequency characteristics of the matching network on the input signal is significantly reduced or prevented.

In addition, since the second switching circuit is provided on the output side of the amplifier and the second switching circuit is turned off (is in a non-conductive state) when bypassing is performed, the effect of the frequency characteristics of the output impedance of the amplifier on the input signal that passes along the bypass path is also significantly reduced or prevented.

Furthermore, the matching network is connected to the amplifier but is not connected to the bypass path and therefore all that needs to be done is to design the matching network so as to be optimal for the amplifier.

As described above, a bypass-path-equipped amplification circuit is realized in which the frequency dependence when bypassing is performed is significantly reduced or prevented compared with the related art.

Here, the first switching circuit and the second switching circuit may be provided on a single semiconductor substrate.

With this configuration, the first switching circuit and the second switching circuit preferably are integrated into a single IC package and therefore the mounting area for components is reduced and a reduction in cost is achieved.

Furthermore, the first switching circuit may include a plurality of input terminals as the one or more input terminals, and the amplification circuit may further include a third switching circuit that includes an input terminal and a plurality of output terminals, and selectively connects the input terminal to any one of the plurality of output terminals; and a plurality of filters that are connected to the plurality of output terminals of the third switching circuit with a one-to-one correspondence; and the plurality of input terminals of the first switching circuit may be connected to output terminals of the plurality of filters with a one-to-one correspondence.

With this configuration, by switching the first switching circuit and the third switching circuit in a coupled manner, an input signal is selectively made to pass through any of the plurality of filters in order to extract only a signal of the required frequency band and selection is able to be performed to amplify the signal or to make the signal pass along the bypass path.

In addition, the first switching circuit and the second switching circuit may be provided on a single semiconductor substrate.

With this configuration, the first switching circuit and the second switching circuit are preferably integrated into a single IC package and therefore the mounting area for components is reduced and a reduction in cost is achieved.

Furthermore, the third switching circuit may also be provided on the single semiconductor substrate.

With this configuration, the third switching circuit is also integrated into the same IC package along with the first switching circuit and the second switching circuit and therefore the mounting area for components is further reduced and a further reduction in cost is achieved.

Alternatively, the third switching circuit may be provided on a semiconductor substrate that is different from the single semiconductor substrate.

With this configuration, since the third switching circuit is provided on a semiconductor substrate that is different from the semiconductor substrate on which the first switching circuit and the second switching circuit are provided, the individual substrates are able to be optimally designed and the freedom of design is increased.

Furthermore, the amplifier may be provided on the single semiconductor substrate on which the first switching circuit and the second switching circuit are provided.

With this configuration, the amplifier is also integrated into the same IC package along with the first switching circuit and the second switching circuit and therefore the mounting area for components is further reduced and a further reduction in cost is achieved.

In addition, the amplification circuit may further include a control circuit that controls the first switching circuit and the second switching circuit, where in a case in which a signal, which has been input to one of the one or more input terminals of the first switching circuit is to be amplified, the control circuit may control the first switching circuit so that the first output terminal of the first switching circuit is connected to the one of the one or more input terminals to which the signal has been input and so that the second output terminal of the first switching circuit is put into an open state and may control the second switching circuit so that the second switching circuit enters a conductive state, and in a case in which the signal, which has been input to one of the one or more input terminals of the first switching circuit is not to be amplified, the control circuit may control the first switching circuit so that the first output terminal of the first switching circuit is put into an open state and the second output terminal of the first switching circuit is connected to the one of the one or more input terminals and may control the second switching circuit so that the second switching circuit enters a non-conductive state.

With this configuration, the first switching circuit, the third switching circuit and the second switching circuit are controlled by the control circuit and an input signal is caused to pass through the appropriate filter in order to extract only the signal of the required frequency band, and then amplification or bypassing is able to be selectively performed in accordance with the power of the signal.

Furthermore, the first switching circuit may include a plurality of input terminals as the one or more input terminals and may include a diplexer or a triplexer that selectively outputs signals input to the plurality of input terminals in accordance with frequency bands of the signals.

With this configuration, the first switching circuit is preferably includes a diplexer or a triplexer and therefore switching (selection of an input signal) is performed in accordance with the frequency bands of signals input to the first switching circuit without the need for a control signal from the outside.

With various preferred embodiments of the present invention, a bypass-path-equipped amplification circuit is realized in which the frequency dependence when bypassing is performed is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereafter, preferred embodiments of the present invention will be described in detail by using the drawings. The preferred embodiments described hereafter each describe specific examples of the present invention. The numerical values, shapes, materials, constituent elements, the arrangement positions of the constituent elements, the ways in which the constituent elements are connected, the control procedure and so on included in the following preferred embodiments are merely examples and are not intended to limit the present invention. Furthermore, constituent elements not described in the independent claim that describes the most generic concept of the present invention among constituent elements in the following preferred embodiments are described as arbitrary constituent elements.

Preferred Embodiment 1

Figure 1:
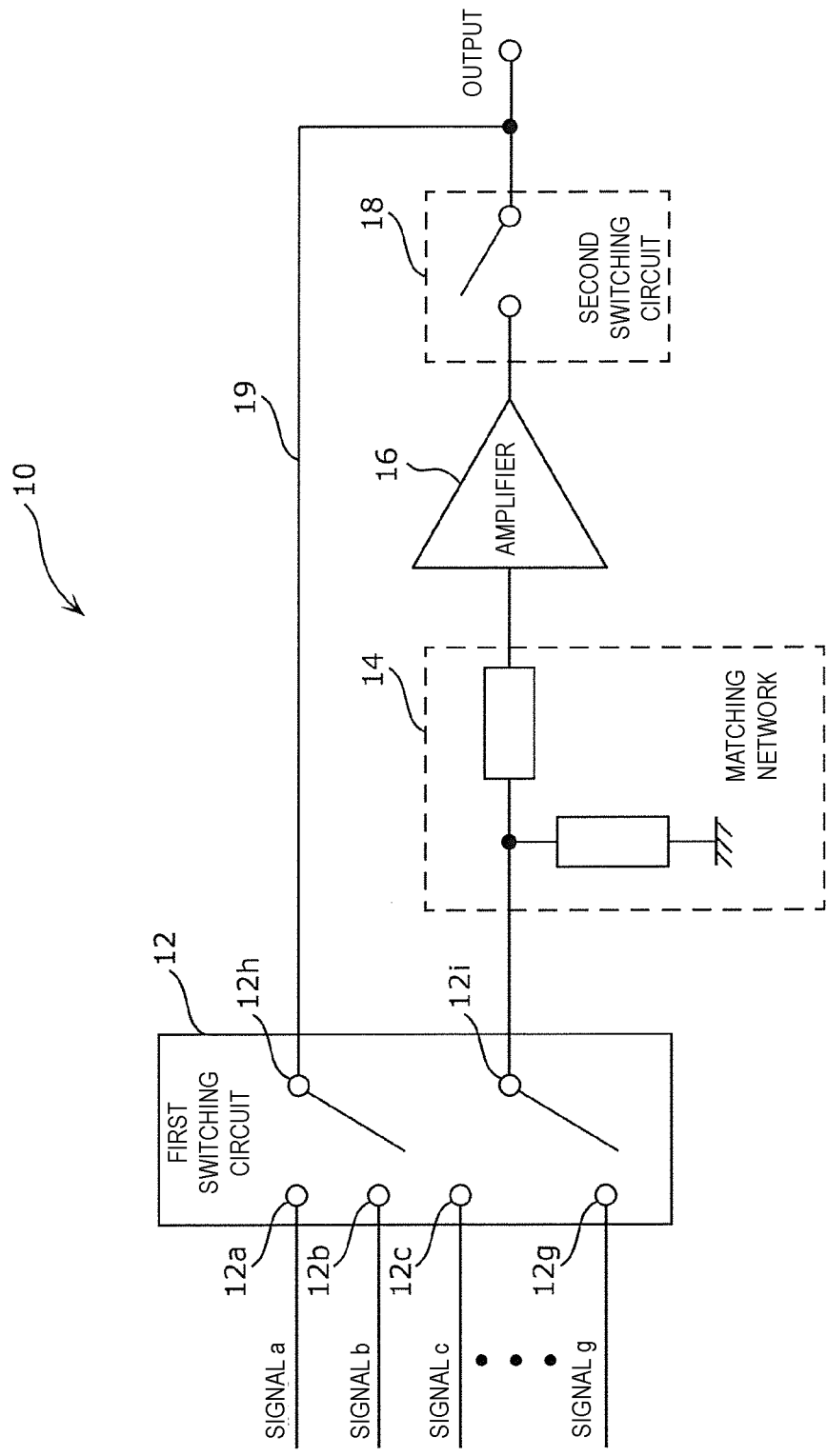
FIG. 1 is a circuit diagram of an amplification circuit of preferred embodiment 1 of the present invention.

FIG. 1 is a circuit diagram of an amplification circuit of preferred embodiment 1 of the present invention. The amplification circuit 10 preferably is a bypass-path-equipped amplification circuit and includes a first switching circuit 12, a matching network 14, an amplifier 16, a second switching circuit 18 and a bypass path 19.

The first switching circuit 12 is a circuit that includes one or more input terminals (here, input terminals 12a to 12g that correspond to signals a to g of a plurality of frequency bands), and a first output terminal 12i and a second output terminal 12h and that puts the second output terminal 12h into an open state of being open with respect to the input terminals 12a to 12g while selectively connecting the first output terminal 12i to any one of the input terminals 12a to 12g or selectively connects the second output terminal 12h to any one of the input terminals 12a to 12g while putting the first output terminal 12i into an open state of being open with respect to the input terminals 12a to 12g, and is, for example, a multiplexer includes an n-pole double throw (nPDT; n being the number of input terminals (here, frequency bands)) high-frequency switch. If the first switching circuit includes a single input terminal, such a first switching circuit will be provided for each of a plurality of frequency bands (that is, as many first switching circuits will be provided as there are bands). In this way, the isolation characteristics of the bands are improved.

The matching network 14 is an input matching network that is connected to the first output terminal 12i of the first switching circuit 12, is provided in order to match the impedance on the input side of the amplifier 16 and includes a capacitor and an inductor, for example.

The amplifier 16 is connected to the output side of the matching network 14 and preferably is, for example, a low-noise amplifier manufactured using a Si—Ge process.

The second switching circuit 18 is a switch that is connected to the output side of the amplifier 16 and is turned on (put into conductive state) or off (put into non-conductive state) in accordance with a control signal input from the outside, and is, for example, a single-pole single-throw (SPST) high-frequency switch.

The bypass path 19 is a signal path that electrically connects the second output terminal 12h of the first switching circuit 12 and an output terminal of the second switching circuit 18, and is, for example, a wiring pattern provided on a substrate.

Although an output matching network to match the impedance on the output side of the amplification circuit 10 is not provided in the amplification circuit 10 of this drawing, an output matching network may be provided between the amplifier 16 and the second switching circuit 18, if desired or necessary.

The thus-configured amplification circuit 10 of this preferred embodiment operates as follows.

In the case in which a signal, which is to be processed, input to one of the plurality of input terminals 12a to 12g of the first switching circuit 12 is a low-power signal (that is, when the input signal is to be amplified), the first switching circuit and the second switching circuit 18 operate as follows in accordance with a control signal from an externally provided control circuit (not illustrated).

That is, the first switching circuit 12 connects the first output terminal 12i to the one of the input terminals 12a to 12g to which the signal to be processed is input and puts the second output terminal 12h into an open state. In addition, the second switching circuit 18 is turned on. As a result, the signal to be processed that has been input to one of the plurality of input terminals 12a to 12g of the first switching circuit 12 passes through the matching network 14, which is isolated from the bypass path 19, is input to the amplifier 16, is amplified by the amplifier 16, and then is output via the second switching circuit 18.

On the other hand, in the case in which a signal, which is to be processed, input to one of the plurality of input terminals 12a to 12g of the first switching circuit 12 is a high-power signal (that is, when the input signal is to be made to pass along the bypass path 19 without being amplified), the first switching circuit 12 and the second switching circuit 18 operate as follows in accordance with a control signal from an externally provided control circuit (not illustrated).

That is, the first switching circuit 12 puts the first output terminal 12i into an open state and connects the second output terminal 12h to the one of the input terminals 12a to 12g to which the signal to be processed is input. In addition, the second switching circuit 18 is turned off. Consequently, the signal to be processed that has been input to one of the plurality of input terminals 12a to 12g of the first switching circuit 12 is output via the second output terminal 12h and the bypass path 19, which are isolated from the matching network 14 and the amplifier 16.

Thus, with the amplification circuit 10 of this preferred embodiment, a signal to be processed that is input to the first switching circuit 12 is output via the second output terminal 12h and the bypass path 19, which are isolated from the matching network 14 (isolated by amount of isolation between the first output terminal 12i and the second output terminal 12h) when bypassing is performed. In other words, when bypassing is performed, the input signal does not pass through the matching network 14, which is connected to the input side of the amplifier 16, and therefore the effect of the frequency characteristics of the matching network 14 on the input signal is significantly reduced or prevented.

Furthermore, since the second switching circuit 18 is provided on the output side of the amplifier 16 and the second switching circuit 18 is turned off when bypassing is performed, the effect of the frequency characteristics of the output impedance of the amplifier 16 on an input signal that passes along the bypass path 19 is also significantly reduced or prevented (significantly reduced or prevented by same amount of isolation as when second switching circuit 18 is off).

Furthermore, the matching network 14 is connected to the amplifier 16 and is not connected to the bypass path 19 (is isolated by amount of isolation between the first output terminal 12i and the second output terminal 12h) and therefore all that needs to be done is to design the matching network so as to be optimal for the amplifier 16 (optimal frequency characteristics taking gain, noise factor and distortion of amplifier 16 into account).

Figure 2B:
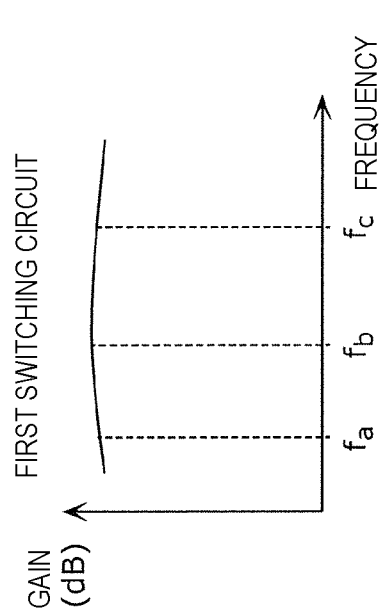
FIGS. 2A and 2B illustrate overviews of bandpass characteristics, when bypassing is performed, of the amplification circuit of preferred embodiment 1 of the present invention.
Figure 2A:
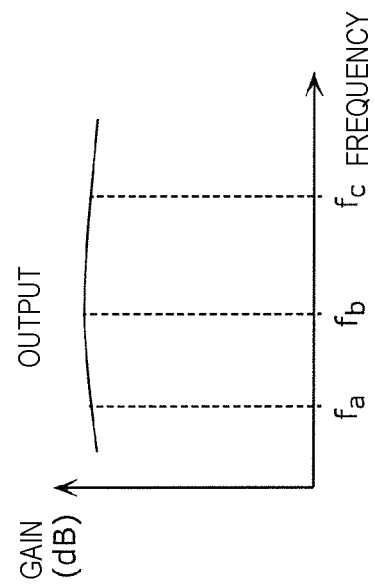

FIGS. 2A and 2B illustrate overviews of bandpass characteristics (frequency characteristics), when bypassing is performed, of the amplification circuit 10 of this preferred embodiment. FIG. 2A illustrates an overview of the bandpass characteristics of the first switching circuit 12 and FIG. 2B illustrates bandpass characteristics, when bypassing is performed, of the entire amplification circuit 10. In FIGS. 2A and 2B, the gains (dB) at frequencies fa, fb and fc of signals a to c input to three input terminals 12a to 12c of the first switching circuit 12 are illustrated.

The difference in gain (that is, the difference in pass loss) across a wide range of frequencies is smaller in bandpass characteristics illustrated in FIGS. 2A and 2B than in the bandpass characteristics of a bypass-path-equipped amplification circuit of the related art. In order to enable easy understanding of this, a bypass-path-equipped amplification circuit of the related art and the bandpass characteristics thereof will be described for reference.

Figure 3:
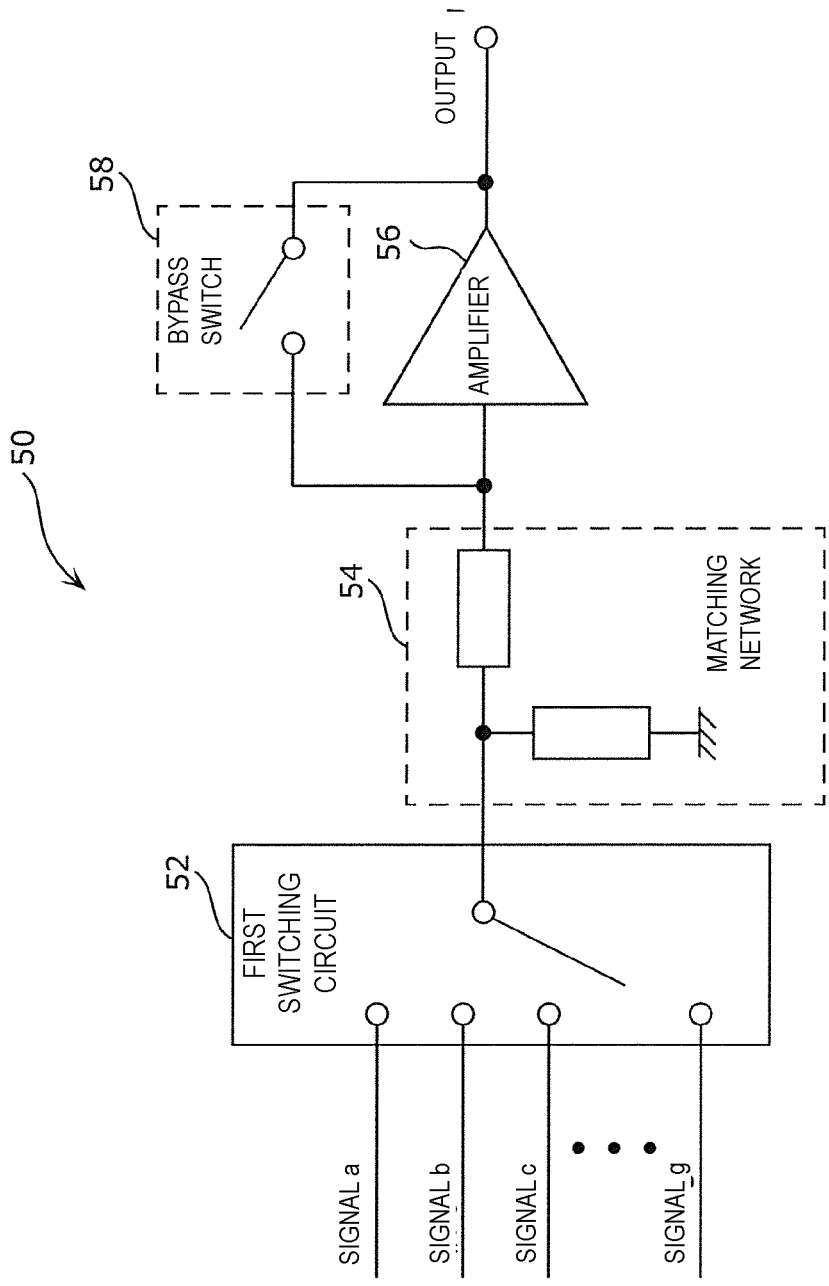
FIG. 3 is a circuit diagram of a bypass-path-equipped amplification circuit of the related art.

FIG. 3 is a circuit diagram of a typical bypass-path-equipped amplification circuit 50 of the related art. The amplification circuit 50 includes a first switching circuit 52, a matching network 54, an amplifier 56 and a bypass switch 58.

The first switching circuit 52 selects one input terminal, from among a plurality of input terminals, to which a signal is input.

The bypass switch 58 is turned off in the case in which the input signal is a low-power signal (that is, when the input signal is to be amplified). As a result, the signal selected by the first switching circuit 52 passes through the matching network 54, is input to the amplifier 56, is amplified by the amplifier 56 and is then output. On the other hand, in the case in which the input signal is a high-power signal (that is, when the input signal is to pass along the bypass path 19 and not be amplified), the bypass switch 58 is turned on. Consequently, the signal selected by the first switching circuit 52 is output via the bypass switch 58 after passing through the matching network 54.

Thus, in the bypass-path-equipped amplification circuit 50 of the related art, when bypassing is performed, an input signal is output via the bypass switch 58 after passing through the matching network 54. Therefore, in the bypass-path-equipped amplification circuit 50 of the related art, the bandpass characteristics when bypassing is performed are affected by both the bandpass characteristics of the matching network 54 and the bandpass characteristics of the bypass switch 58.

Figure 4:
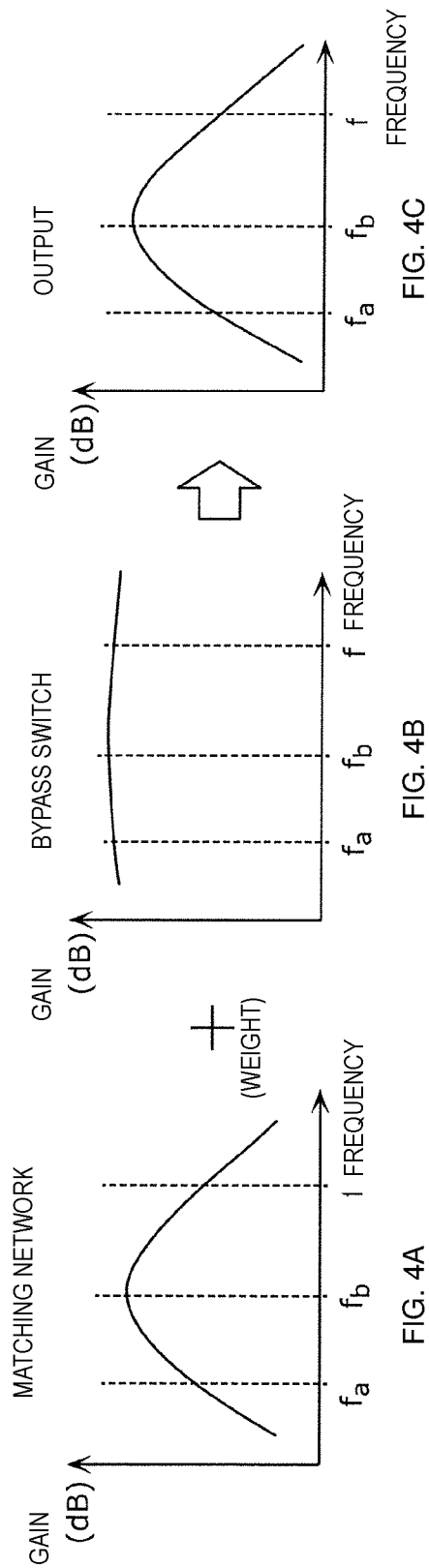
FIGS. 4A to 4C illustrate overviews of bandpass characteristics, when bypassing is performed, of the bypass-path-equipped amplification circuit of the related art.

FIGS. 4A to 4C illustrate overviews of the bandpass characteristics (frequency characteristics), when bypassing is performed, of the bypass-path-equipped amplification circuit 50 of the related art illustrated in FIG. 3. FIG. 4A illustrates an overview of the bandpass characteristics of the matching network 54, FIG. 4B illustrates an overview of the bandpass characteristics of the bypass switch 58 and FIG. 4C illustrates an overview of the bandpass characteristics, when bypassing is performed, of the entire amplification circuit 50. Here, it is illustrated that the bandpass characteristics, when bypassing is performed, of the entire amplification circuit 50 (FIG. 4C) is obtained by combining the bandpass characteristics of the matching network 54 (FIG. 4A) and the bandpass characteristics of the bypass switch 58 (FIG. 4B). The frequencies along the horizontal axis are the same as in FIGS. 2A and 2B.

In the bypass-path-equipped amplification circuit 50 of the related art, since the input signal passes through the matching network 54 when bypassing is performed, the input signal is affected by the frequency characteristics of the matching network 54 as illustrated in FIG. 4A (that is, frequency characteristics having a narrow pass band) and consequently the bypass-path-equipped amplification circuit 50 of the related art has bandpass characteristics having a narrow pass band as illustrated in FIG. 4C.

As is clear from comparing FIGS. 2A and 2B and FIGS. 4A to 4C, the frequency dependency when bypassing is performed is significantly reduced or prevented in the amplification circuit 10 of this preferred embodiment compared with the amplification circuit 50 of the related art.

In the amplification circuit 10 of this preferred embodiment, the respective circuit blocks may be defined individual IC packages or be defined by a shared IC package.

For example, the first switching circuit 12, the matching network 14, the amplifier 16 and the second switching circuit 18 may be defined by individual IC packages. That is, the first switching circuit 12, the matching network 14, the amplifier and the second switching circuit 18 may be provided on individual semiconductor substrates. At this time, for example, the first switching circuit 12 and the second switching circuit 18 would be manufactured using a silicon-on-insulator (SOI) process and the amplifier 16 would be manufactured using a Si—Ge process.

Figure 5:
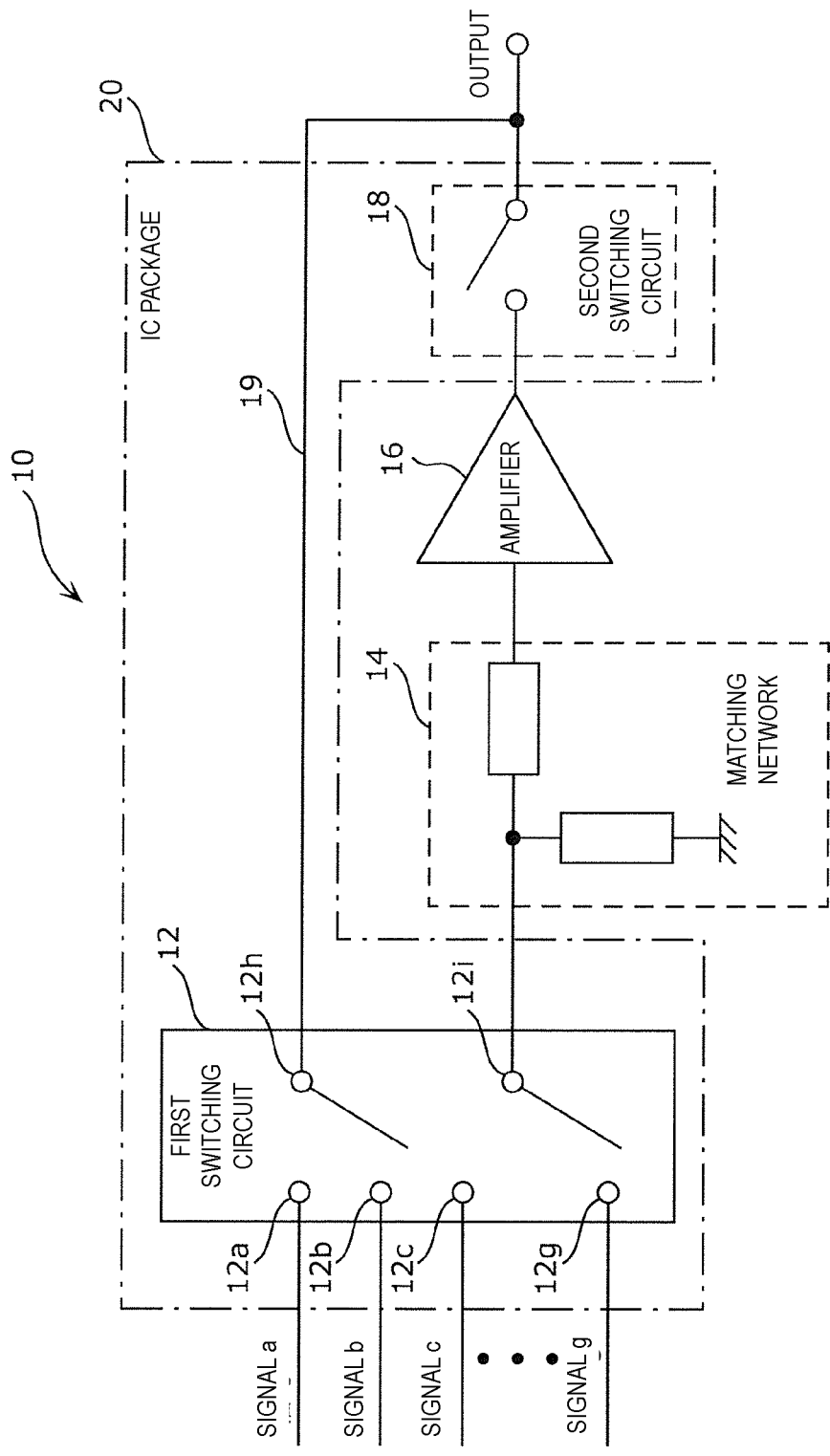
FIG. 5 illustrates an example of a package of the amplification circuit of preferred embodiment 1 of the present invention.

As illustrated in FIG. 5, the first switching circuit 12 and the second switching circuit 18 may defined as a single IC package 20. That is, the first switching circuit 12 and the second switching circuit 18 may be provided on a single semiconductor substrate. At this time, the IC package 20 would be manufactured using a SOI process, for example. Thus, the mounting area for the components of the amplification circuit 10 is reduced and a reduction in cost is achieved.

Figure 6:
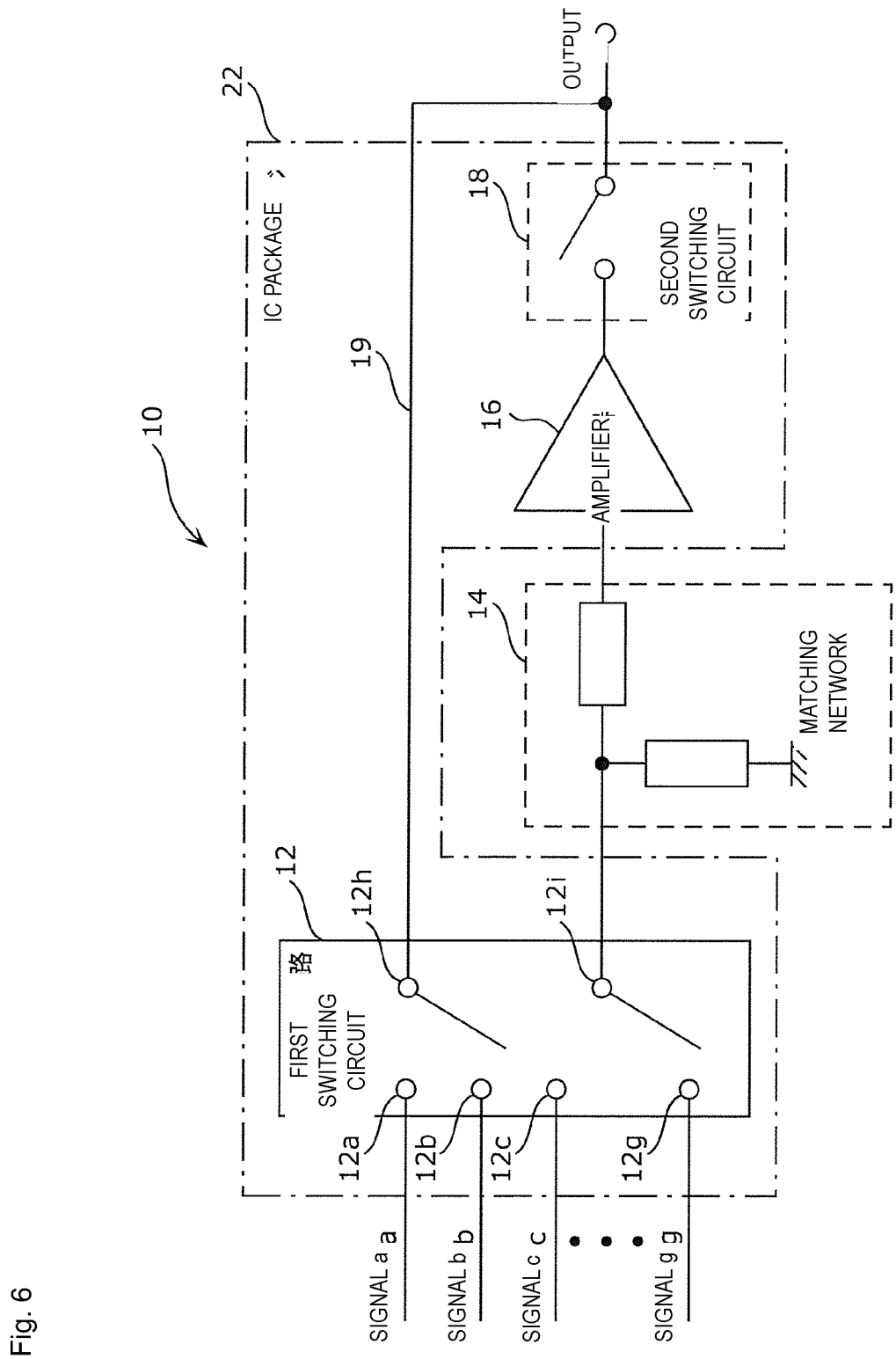
FIG. 6 illustrates another example of a package of the amplification circuit of preferred embodiment 1 of the present invention.

As illustrated in FIG. 6, along the first switching circuit 12 and the second switching circuit 18, the amplifier 16 may also be defined by a single IC package 22. That is, the first switching circuit 12, the second switching circuit 18 and the amplifier 16 may be provided on a single semiconductor substrate. At this time, the IC package 22 would be manufactured using a SOI process, for example. Thus, the mounting area for the components of the amplification circuit 10 is further reduced and a further reduction in cost is achieved.

Preferred Embodiment 2

Next an amplification circuit of preferred embodiment 2 of the present invention will be described.

Figure 7:
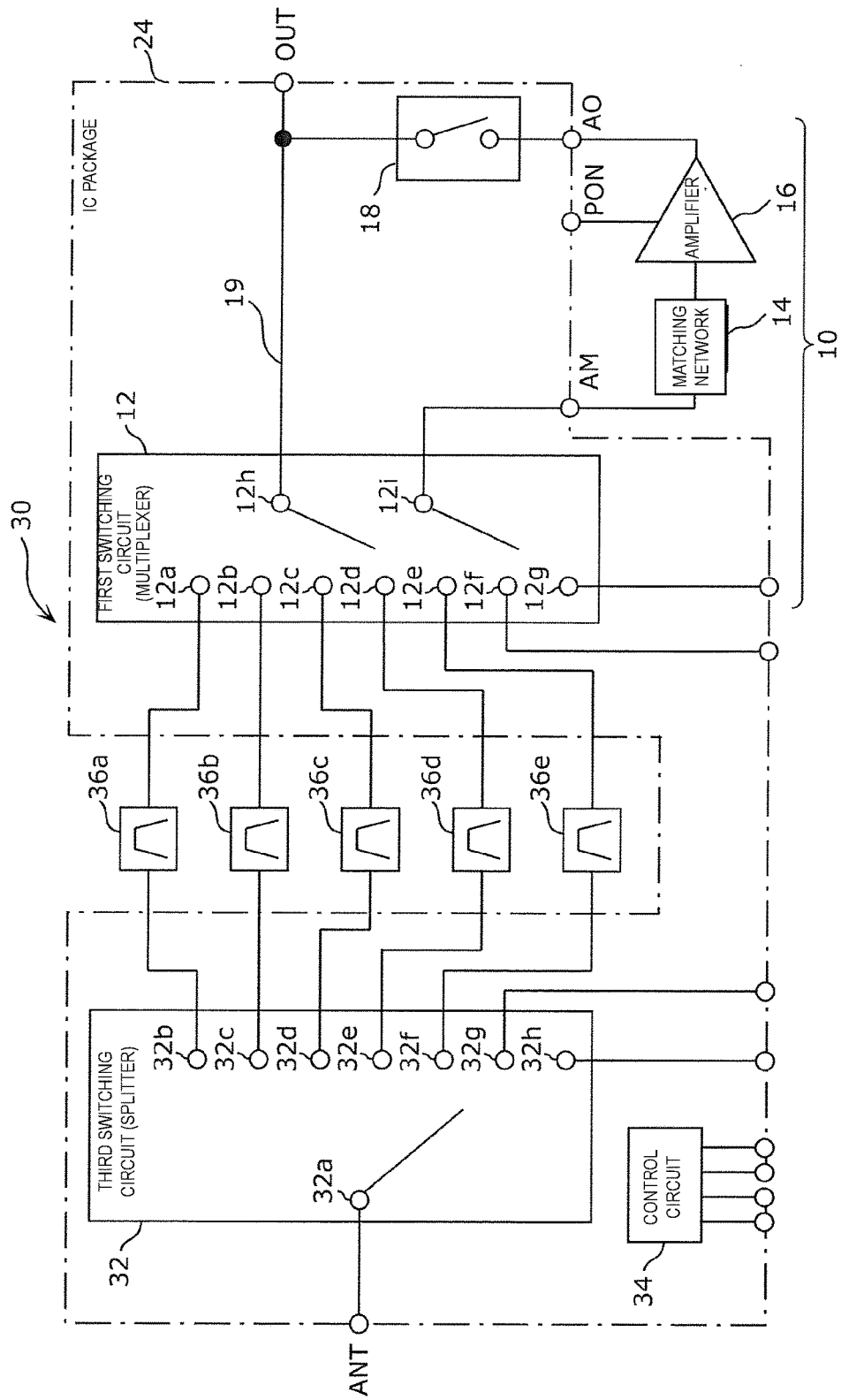
FIG. 7 is a circuit diagram of an amplification circuit of preferred embodiment 2 of the present invention.

FIG. 7 is a circuit diagram of an amplification circuit 30 of preferred embodiment 2 of the present invention. The amplification circuit 30 is a high-frequency module that selects and amplifies one signal from among signals of a plurality of frequency bands received by an antenna and includes a third switching circuit 32, a control circuit 34 and filters 36a to 36e in addition to the constituent components of the amplification circuit 10 of preferred embodiment 1.

The third switching circuit 32 is a circuit that includes an input terminal 32a and a plurality of output terminals 32b to 32h and that selectively connects the input terminal 32a to any of the plurality of output terminals 32b to 32h in accordance with a control signal input from the control circuit 34, and is, for example, a splitter includes a single pole n throw (SPnT; n being the number of output terminals (here, number of frequency bands)) high-frequency switch.

The filters 36a to 36e are filter circuits that are connected with a one-to-one correspondence to the output terminals 32b to 32f of the third switching circuit 32 and are each, for example, a band pass filter, a low pass filter or a high pass filter that allows just a signal of the corresponding frequency band to pass therethrough. The output terminals of the filters 36a to 36e are connected with a one-to-one correspondence to input terminals 12a to 12e of the first switching circuit 12. Filters may be connected between the output terminal 32g and the input terminal 12f and between the output terminal 32h and the input terminal 12g, as necessary. The output terminal 32g and the input terminal 12f and the output terminal 32h and the input terminal 12g may be directly electrically connected to each other with wiring lines. The output terminal 32g and the input terminal 12f and the output terminal 32h and the input terminal 12g may be unconnected (open terminals). Termination impedance elements (for example, 50Ω resistors) may be connected to the output terminal 32g, the output terminal 32h, the input terminal 12f and the input terminal 12g.

The control circuit 34 outputs control signals to the first switching circuit 12, the third switching circuit 32 and the second switching circuit 18, and thus switches the first switching circuit 12 and the third switching circuit 32 in a coupled manner in accordance with the frequency band of an input signal to be processed and switches the second switching circuit 18 on or off in accordance with the magnitude of the power of the input signal (that is, in accordance with whether the input signal is to be amplified).

In the amplification circuit 30, the first switching circuit 12, the third switching circuit 32, the second switching circuit 18 and the control circuit 34 are provided in a single IC package 24. That is, the first switching circuit 12, the third switching circuit 32, the second switching circuit 18 and the control circuit 34 are provided on a single semiconductor substrate. The IC package 24, for example, preferably may be manufactured using an SOI process and includes, as main terminals, an ANT terminal that is connected to the input terminal 32a of the third switching circuit 32, an AM terminal that is connected to the first output terminal 12i of the first switching circuit 12, a PON terminal that supplies power to the amplifier 16, an AO terminal that is connected to the input terminal of the second switching circuit 18 and an OUT terminal that is connected to the second output terminal 12h of the first switching circuit 12 and the output terminal of the second switching circuit 18.

The thus-configured amplification circuit 30 of this preferred embodiment operates as follows.

Upon determining that an input signal to be processed is a signal of a first frequency band (frequency band handled by the filter 36a) among seven frequency bands and that the input signal is a low-power signal (that is, the input signal is to be amplified), the control circuit 34 controls the third switching circuit 32 to connect the input terminal 32a to the output terminal 32b, controls the first switching circuit 12 to connect the first output terminal 12i to the input terminal 12a and put the second output terminal 12h into an open state and switches the second switching circuit 18 on. Thus, a low-power input signal, which is input to the ANT terminal, passes through the third switching circuit 32 from the input terminal 32a to the output terminal 32b, passes through the filter 36a, is input to the input terminal 12a of the first switching circuit 12, passes through the AM terminal from the first output terminal 12i of the first switching circuit 12, passes through the matching network 14, is input to the amplifier 16, is amplified by the amplifier 16, passes through the AO terminal, passes through the second switching circuit 18 and is output from the OUT terminal.

On the other hand, upon determining that an input signal to be processed is a signal of the first frequency band (frequency band handled by the filter 36a) among the seven frequency bands and that the input signal is a high-power signal (that is, the input signal is not to be amplified and is to be made to pass along the bypass path 19), the control circuit 34 controls the third switching circuit 32 to connect the input terminal 32a to the output terminal 32b, controls the first switching circuit 12 to put the first output terminal 12i into an open state and to connect the second output terminal 12h to the input terminal 12a and switches the second switching circuit 18 off. Thus, a high-power input signal, which is input to the ANT terminal, passes through the third switching circuit 32 from the input terminal 32a to the output terminal 32b, passes through the first switching circuit 12 from the input terminal 12a to the second output terminal 12h, passes along the bypass path 19, which is isolated from the matching network 14 and the amplifier 16, and is output from the OUT terminal.

In the case in which the input signal to be processed is a signal of another frequency band among the seven frequency bands (for example, the frequency band handled by the filter 36b), the control circuit 34 controls the third switching circuit 32 to connect the input terminal 32a to the corresponding output terminal (for example, the output terminal 32c), controls the first switching circuit 12 to connect either the first output terminal 12i or the second output terminal 12h to the corresponding input terminal (for example, the input terminal 12b) and to put the other of the first output terminal 12i and the second output terminal 12h into an open state in accordance with the magnitude of the power of the input signal. Thus, the signal input to the ANT terminal passes through the third switching circuit 32, passes through the corresponding filter (for example, the filter 36b), is input to the first switching circuit 12, and then is amplified by the amplifier 16 and output or passes along the bypass path 19 and is output in accordance with the magnitude of the power of the input signal.

Thus, the amplification circuit 30 of this preferred embodiment includes an amplification circuit 10 that is the same as that of preferred embodiment 1 as a rear-stage circuit. Therefore, the same effect as with preferred embodiment 1 is exhibited.

Furthermore, in addition to the amplification circuit 10 of preferred embodiment 1, the amplification circuit 30 of this preferred embodiment includes, as a front-stage circuit, the third switching circuit 32, which switches a signal in a coupled manner with the first switching circuit 12 of the amplification circuit 10, the filters 36a to 36e that are provided between the third switching circuit 32 and the first switching circuit 12, and the control circuit 34 that controls the first switching circuit 12, the third switching circuit 32 and the second switching circuit 18. Thus, a signal input to the ANT terminal is made to pass through the appropriate filter among the filters 36a to 36e in order to extract only the signal of the required frequency band, and a selection is made to amplify the signal with the amplifier 16 or to make the signal pass along the bypass path 19.

In this preferred embodiment, the first switching circuit 12, the third switching circuit 32, the second switching circuit 18 and the control circuit 34 are preferably provided in the single IC package 24, but may instead be provided in two or more IC packages. For example, the first switching circuit 12 and the second switching circuit 18 may be provided by one IC package (provided on one semiconductor substrate) and the third switching circuit 32 and the control circuit 34 may be provided by another IC package (provided on another semiconductor substrate). In this way, the individual semiconductor substrates are able to be optimally designed and the freedom of design is increased.

Furthermore, the amplifier 16 may be provided on a semiconductor substrate on which the first switching circuit 12, the third switching circuit 32, the second switching circuit 18 and the control circuit 34 are provided (provided in same IC package) or may be provided on a semiconductor substrate on which only the first switching circuit 12 and the second switching circuit 18 are provided (provided in same IC package). At this time, for example, the IC package including the amplifier 16 would be manufactured using an SOI process. Thus, the mounting area for the components forming the amplification circuit 30 is reduced and a reduction in cost is achieved.

An amplification circuit according to a preferred embodiment of the present invention has been described above on the basis of preferred embodiments 1 and 2, but the present invention is not limited to these preferred embodiments. Various modifications to the preferred embodiments and other preferred embodiments formed by combining some of the constituent elements of the preferred embodiments are to be included in the scope of the present invention so long as the modifications and other preferred embodiments do not depart from the gist of the present invention.

For example, the first switching circuit 12 and the third switching circuit 32 are each preferably defined by a high-frequency switch as an example, but may instead be defined by a high-frequency switching circuit that includes a filter such as a diplexer (or a duplexer) or a triplexer.

Figure 8A:
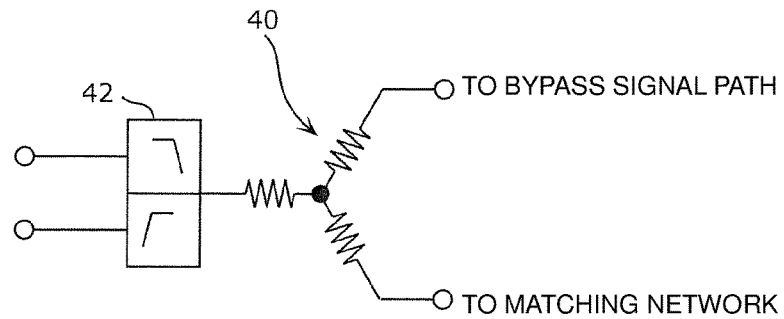
FIGS. 8A to 8C illustrate examples in which a first switching circuit of an amplification circuit includes a diplexer or a triplexer.
Figure 8B:
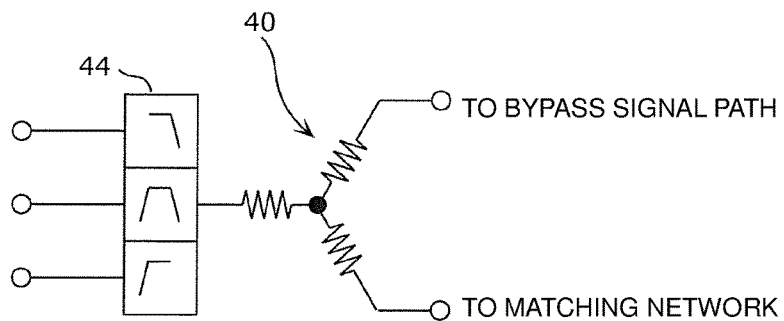
Figure 8C:
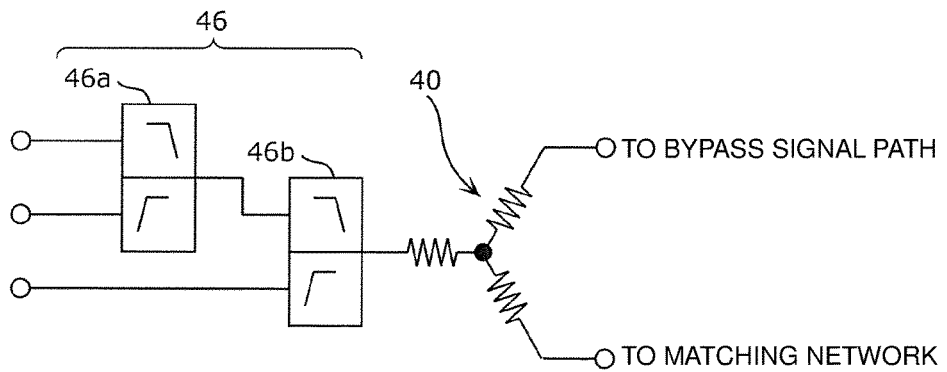

FIGS. 8A to 8C illustrate examples in which the first switching circuit 12 includes a diplexer or a triplexer. FIG. 8A illustrates a two-input two-output switching circuit that includes a diplexer 42 and a divider 40. A high-frequency switch (not illustrated) may be connected to each of the two output terminals of the divider 40. With this configuration, either one of input signals of different frequency bands input to the two input terminals may be selected and output by the diplexer 42 and output to a bypass signal path or a matching network via the divider 40.

FIG. 8B illustrates a three-input two-output switching circuit that includes a triplexer 44 and the divider 40. A high-frequency switch (not illustrated) may be connected to each of the two output terminals of the divider 40. With this configuration, any one of input signals of different frequency bands input to the three input terminals may be selected and output by the triplexer 44 and output to a bypass signal path or a matching network via the divider 40.

FIG. 8C illustrates a three-input two-output switching circuit that includes a triplexer 46, which includes two diplexers 46a and 46b, and the divider 40. A high-frequency switch (not illustrated) may be connected to each of the two output terminals of the divider 40.

With this configuration, any one of input signals of different frequency bands input to the three input terminals may be selected and output by the triplexer 46 and output to a bypass signal path or a matching network via the divider 40.

Similarly, the third switching circuit 32 may also include a filter such as a diplexer, a triplexer or a combination of diplexers and triplexers. Accordingly, the first switching circuit 12 and the third switching circuit 32 include a filter such as a diplexer or a triplexer, and switching (selection of input signal) is performed in accordance with the frequency band of an input signal without the need for a control signal from the outside.

Figure 9:
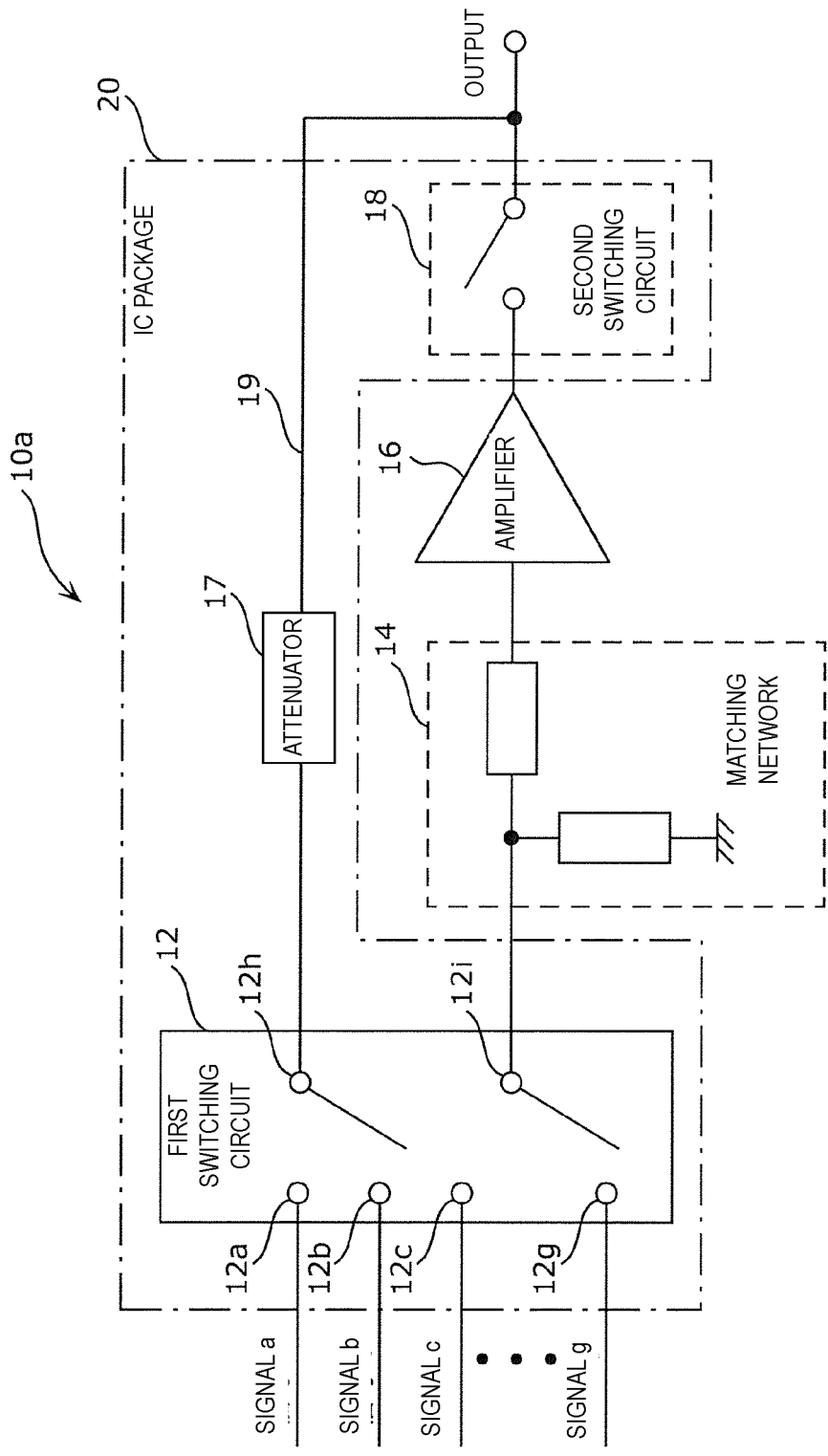
FIG. 9 is a circuit diagram of an amplification circuit according to a modification of a preferred embodiment of the present invention.

Furthermore, in preferred embodiments 1 and 2, the bypass path 19 preferably includes just a signal path, but, not limited to this, an attenuator may be provided along the signal path. FIG. 9 is a circuit diagram of an amplification circuit 10a according to a modification defined by providing an attenuator 17 along the bypass path 19 of the amplification circuit 10 illustrated in FIG. 5. The attenuator 17 is a variable attenuator that attenuates a signal and, for example, is able to change the amount of attenuation in accordance with a control signal from the outside. According to the amplification circuit 10a, which includes such an attenuator 17, the level of insertion loss when an input signal is made to pass along the bypass path 19 is able to be changed.

Furthermore, in preferred embodiment 2, the control circuit 34 is provided in the same IC package as the third switching circuit 32, but the control circuit 34 may instead be provided in a different IC package to the third switching circuit 32. Thus, the control circuit 34 is able to be optimally designed independently of the other circuits and the freedom of design is increased.

Various preferred embodiments of the present invention are able to be used as an amplifier that includes a bypass path, for example, as a high-frequency module selects whether to amplify or to pass therethrough any of signals of a plurality of frequency bands received by an antenna.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An amplification circuit comprising:
   a first switching circuit that includes one or more input terminals, a first output terminal and a second output terminal, and that puts the second output terminal into an open state of being open with respect to each of the one or more input terminals while selectively putting the first output terminal into a connected state of being connected to any one of the one or more input terminals or selectively puts the second output terminal into a connected state of being connected to any one of the one or more input terminals while putting the first output terminal into an open state of being open with respect to each of the one or more input terminals;
   a matching network that is connected to the first output terminal;
   an amplifier that is connected to an output side of the matching network;
   a second switching circuit that is connected to an output side of the amplifier and enters a non-conductive state when the first switching circuit puts the first output terminal into the open state and selectively puts the second output terminal into the connected state of being connected to any one of the one or more input terminals; and a bypass path that electrically connects the second output terminal and an output terminal of the second switching circuit.

2. The amplification circuit according to claim 1, wherein the first switching circuit and the second switching circuit are provided on a single semiconductor substrate.

3. The amplification circuit according to claim 1, further comprising:
a third switching circuit that includes an input terminal and a plurality of output terminals, and selectively connects the input terminal to any one of the plurality of output terminals; and
a plurality of filters that are connected to the plurality of output terminals of the third switching circuit with a one-to-one correspondence; wherein
the first switching circuit includes a plurality of input terminals defining the one or more input terminals; and
the plurality of input terminals of the first switching circuit are connected to output terminals of the plurality of filters with a one-to-one correspondence.

4. The amplification circuit according to claim 3, wherein the first switching circuit and the second switching circuit are provided on a single semiconductor substrate.

5. The amplification circuit according to claim 4, wherein the third switching circuit is provided on the single semiconductor substrate.

6. The amplification circuit according to claim 4, wherein the third switching circuit is provided on a semiconductor substrate different from the single semiconductor substrate.

7. The amplification circuit according to claim 2, wherein the amplifier is provided on the single semiconductor substrate on which the first switching circuit and the second switching circuit are provided.

8. The amplification circuit according to claim 1, further comprising:
a control circuit that controls the first switching circuit and the second switching circuit; wherein
the control circuit:
in a case in which a signal, which has been input to one of the one or more input terminals of the first switching circuit is to be amplified, controls the first switching circuit so that the first output terminal of the first switching circuit is connected to the one of the one or more input terminals to which the signal has been input and so that the second output terminal of the first switching circuit is put into an open state and controls the second switching circuit so that the second switching circuit enters a conductive state; and in a case in which the signal, which has been input to one of the one or more input terminals of the first switching circuit is not to be amplified, controls the first switching circuit so that the first output terminal of the first switching circuit is put into an open state and the second output terminal of the first switching circuit is connected to the one of the one or more input terminals and controls the second switching circuit so that the second switching circuit enters a non-conductive state.

9. The amplification circuit according to claim 1, wherein the first switching circuit includes a plurality of input terminals defining the one or more input terminals and includes a diplexer or a triplexer that selectively outputs signals input to the plurality of input terminals in accordance with frequency bands of the signals.

10. The amplification circuit according to claim 1, wherein the first switching circuit includes a multiplexer including an n-pole double throw high-frequency switch.

11. The amplification circuit according to claim 1, wherein the first switching circuit includes only one input terminal, and a plurality of the first switching circuit is provided each of a plurality of frequency bands.

12. The amplification circuit according to claim 1, wherein the matching network is an input matching network that matches an impedance on an input side of the amplifier and includes a capacitor and an inductor.

13. The amplification circuit according to claim 1, wherein the amplifier is a low-noise amplifier including a Si—Ge processed material.

14. The amplification circuit according to claim 1, wherein the second switching circuit is a single-pole single-throw high-frequency switch.

15. The amplification circuit according to claim 1, wherein the bypass path includes a wiring pattern provided on a substrate.

16. The amplification circuit according to claim 1, further comprising an output matching network provided between the amplifier and the second switching circuit.

17. The amplification circuit according to claim 1, wherein at least one of the first switching circuit, the matching network, the amplifier and the second switching circuit is defined by an individual IC package.

18. The amplification circuit according to claim 1, wherein the first switching circuit and the second switching circuit are provided in a single individual IC package.

19. The amplification circuit according to claim 3, wherein the third switching circuit includes a splitter including a single pole n throw high-frequency switch, where n is a number of output terminals.

20. The amplification circuit according to claim 3, wherein the first switching circuit includes a diplexer or a triplexer.

* * * * *